(12) United States Patent
Masleid et al.

(10) Patent No.: US 8,018,252 B2
(45) Date of Patent: Sep. 13, 2011

(54) CIRCUIT WITH ENHANCED MODE AND NORMAL MODE

(76) Inventors: Robert Paul Masleid, Monte Sereno, CA (US); Vatsal Dholabhai, Portola Valley, CA (US)

(*) Notice: Subject to any disclaimer, the term of this patent is extended or adjusted under 35 U.S.C. 154(b) by 68 days.

(21) Appl. No.: 12/546,960

(22) Filed: Aug. 25, 2009

(65) Prior Publication Data

US 2009/0309631 A1    Dec. 17, 2009

Related U.S. Application Data

(63) Continuation of application No. 11/999,293, filed on Dec. 4, 2007, now Pat. No. 7,592,839, which is a continuation of application No. 10/879,645, filed on Jun. 28, 2004, now Pat. No. 7,304,503, which is a continuation-in-part of application No. 10/864,271, filed on Jun. 8, 2004, now Pat. No. 7,336,103.

(51) Int. Cl.
*H03K 19/0173* (2006.01)
*H03K 19/094* (2006.01)

(52) U.S. Cl. .................. 326/86; 326/23; 326/27; 326/34

(58) Field of Classification Search .................... 326/86, 326/23, 27, 31, 34
See application file for complete search history.

(56) References Cited

U.S. PATENT DOCUMENTS

| | | | |
|---|---|---|---|
| 3,991,280 A | 11/1976 | James et al. | |
| 4,498,021 A | 2/1985 | Uya | |
| 4,700,089 A | 10/1987 | Fujii et al. | |
| 4,739,252 A | 4/1988 | Malaviya et al. | |
| 4,760,279 A | 7/1988 | Saito et al. | |
| 5,039,893 A | 8/1991 | Tomisawa | |
| 5,128,560 A | 7/1992 | Chern et al. | |
| 5,166,555 A | 11/1992 | Kano | |
| 5,227,679 A | 7/1993 | Woo | |
| 5,264,738 A | 11/1993 | Veendrick et al. | |
| 5,297,086 A | 3/1994 | Nasu et al. | |
| 5,410,278 A | 4/1995 | Itoh et al. | |
| 5,414,312 A | 5/1995 | Wong | |
| 5,455,521 A | 10/1995 | Dobbelaere | |
| 5,467,038 A | 11/1995 | Motley et al. | |
| 5,497,105 A | 3/1996 | Oh et al. | |
| 5,525,616 A | 6/1996 | Platt et al. | |
| 5,568,103 A | 10/1996 | Nakashima et al. | |
| 5,587,665 A | 12/1996 | Jiang | |
| 5,594,360 A | 1/1997 | Wojciechowski et al. | |
| 5,610,548 A | 3/1997 | Masleid | |

(Continued)

FOREIGN PATENT DOCUMENTS

EP    1398639    3/2004

(Continued)

OTHER PUBLICATIONS

Lima T., et al.; "Capacitance Coupling Immune, Transient Sensitive Accelerator for Resistive Interconnect Signals of Subquater Micron ULSI", IEEE Journal of Solid-State Circuits, IEEE Inc., New York, US, vol. 31, No. 4, Apr. 1996, pp. 531-536.

(Continued)

*Primary Examiner* — Daniel D Chang (57) ABSTRACT

Circuit with enhanced mode and normal mode is provided and described. In one embodiment, switches are set to a first switch position to operate the circuit in the enhanced mode. In another embodiment, switches are set to a second switch position to operate the circuit in the normal mode.

24 Claims, 3 Drawing Sheets

U.S. PATENT DOCUMENTS

| | | | |
|---|---|---|---|
| 5,614,845 A | 3/1997 | Masleid | |
| 5,656,963 A | 8/1997 | Masleid et al. | |
| 5,677,650 A | 10/1997 | Kwasniewski et al. | |
| 5,680,359 A | 10/1997 | Jeong et al. | |
| 5,698,994 A | 12/1997 | Tsuji | |
| 5,739,715 A | 4/1998 | Rawson | |
| 5,764,110 A | 6/1998 | Ishibashi et al. | |
| 5,767,700 A | 6/1998 | Lee | |
| 5,777,501 A | 7/1998 | AbouSeido | |
| 5,778,214 A | 7/1998 | Taya et al. | |
| 5,791,715 A | 8/1998 | Nebel | |
| 5,793,715 A | 8/1998 | Alon et al. | |
| 5,796,313 A | 8/1998 | Eitan | |
| 5,797,105 A | 8/1998 | Nakaya et al. | |
| 5,811,893 A | 9/1998 | Soyck | |
| 5,880,608 A | 3/1999 | Mehta et al. | |
| 5,894,419 A | 4/1999 | Galambos et al. | |
| 5,926,050 A | 7/1999 | Proebsting | |
| 5,963,043 A | 10/1999 | Nassif | |
| 5,963,074 A | 10/1999 | Arkin | |
| 5,969,543 A | 10/1999 | Erickson et al. | |
| 5,977,763 A | 11/1999 | Loughmiller et al. | |
| 5,982,211 A | 11/1999 | Ko | |
| 6,011,403 A | 1/2000 | Gillette | |
| 6,025,738 A | 2/2000 | Masleid | |
| 6,028,490 A | 2/2000 | Komatsu | |
| 6,031,403 A | 2/2000 | Gersbach | |
| 6,069,506 A | 5/2000 | Miller, Jr. et al. | |
| 6,087,886 A | 7/2000 | Ko | |
| 6,111,447 A | 8/2000 | Ternullo, Jr. | |
| 6,114,840 A | 9/2000 | Farrell et al. | |
| 6,127,872 A | 10/2000 | Kumata | |
| 6,154,099 A | 11/2000 | Suzuki et al. | |
| 6,154,100 A | 11/2000 | Okamoto | |
| 6,160,755 A | 12/2000 | Norman et al. | |
| 6,172,545 B1 | 1/2001 | Ishii | |
| 6,172,943 B1 | 1/2001 | Yuzuki | |
| 6,188,260 B1 | 2/2001 | Stotz et al. | |
| 6,198,334 B1 | 3/2001 | Tomobe et al. | |
| 6,204,710 B1 | 3/2001 | Goetting et al. | |
| 6,229,747 B1 | 5/2001 | Cho et al. | |
| 6,242,936 B1 | 6/2001 | Ho et al. | |
| 6,242,937 B1 | 6/2001 | Lee et al. | |
| 6,262,601 B1 | 7/2001 | Choe et al. | |
| 6,275,091 B1 | 8/2001 | Saeki | |
| 6,281,706 B1 | 8/2001 | Wert et al. | |
| 6,285,230 B1 | 9/2001 | Na | |
| 6,294,930 B1 | 9/2001 | Goetting et al. | |
| 6,321,282 B1 | 11/2001 | Horowitz et al. | |
| 6,323,706 B1 | 11/2001 | Stark et al. | |
| 6,366,115 B1 | 4/2002 | DiTommaso | |
| 6,373,291 B1 * | 4/2002 | Hamada et al. | 326/113 |
| 6,407,571 B1 | 6/2002 | Furuya et al. | |
| 6,426,641 B1 | 7/2002 | Koch et al. | |
| 6,426,652 B1 | 7/2002 | Greenhill et al. | |
| 6,455,901 B2 | 9/2002 | Kameyama et al. | |
| 6,459,319 B2 | 10/2002 | Sako | |
| 6,466,063 B2 | 10/2002 | Chen | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 | 3/2003 | Aipperspach et al. | |
| 6,545,519 B1 | 4/2003 | Carballo | |
| 6,570,407 B1 | 5/2003 | Sugisawa et al. | |
| 6,573,777 B2 | 6/2003 | Saint-Laurent et al. | |
| 6,577,157 B1 | 6/2003 | Cheung et al. | |
| 6,577,176 B1 | 6/2003 | Masleid et al. | |
| 6,621,318 B1 | 9/2003 | Burr | |
| 6,657,504 B1 | 12/2003 | Deal et al. | |
| 6,664,837 B1 | 12/2003 | Oh et al. | |
| 6,690,242 B2 | 2/2004 | Fang et al. | |
| 6,697,929 B1 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore | |
| 6,762,638 B2 | 7/2004 | Correale, Jr. et al. | |
| 6,762,966 B1 | 7/2004 | LaRosa et al. | |
| 6,768,363 B2 | 7/2004 | Yoo et al. | |
| 6,774,734 B2 | 8/2004 | Christensen et al. | |
| 6,798,230 B1 | 9/2004 | Taylor et al. | |
| 6,815,971 B2 | 11/2004 | Wang et al. | |
| 6,815,977 B2 | 11/2004 | Sabbavarapu et al. | |
| 6,831,494 B1 | 12/2004 | Fu et al. | |
| 6,879,200 B2 | 4/2005 | Komura et al. | |
| 6,882,172 B1 | 4/2005 | Suzuki et al. | |
| 6,885,210 B1 | 4/2005 | Suzuki | |
| 6,903,564 B1 | 6/2005 | Suzuki | |
| 6,924,669 B2 | 8/2005 | Itoh et al. | |
| 7,046,063 B2 * | 5/2006 | Kuang et al. | 327/201 |
| 7,053,660 B2 | 5/2006 | Itoh et al. | |
| 7,053,680 B2 | 5/2006 | Masleid et al. | |
| 7,119,580 B2 | 10/2006 | Masleid et al. | |
| 7,142,018 B2 | 11/2006 | Masleid et al. | |
| 7,173,455 B2 | 2/2007 | Masleid et al. | |
| 7,239,170 B2 | 7/2007 | Suen et al. | |
| 7,271,638 B2 | 9/2007 | Takai et al. | |
| 7,295,041 B1 | 11/2007 | Masleid et al. | |
| 7,304,503 B2 | 12/2007 | Masleid et al. | |
| 7,336,103 B1 | 2/2008 | Masleid et al. | |
| 2001/0000426 A1 | 4/2001 | Sung et al. | |
| 2001/0028278 A1 | 10/2001 | Ooishi | |
| 2001/0030561 A1 | 10/2001 | Asano et al. | |
| 2001/0052623 A1 | 12/2001 | Kameyama et al. | |
| 2002/0056016 A1 | 5/2002 | Horowitz et al. | |
| 2002/0178415 A1 | 11/2002 | Saraf | |
| 2003/0005775 A1 | 1/2003 | Washeleski et al. | |
| 2003/0011413 A1 | 1/2003 | Masleid | |
| 2003/0042960 A1 | 3/2003 | Gomm | |
| 2003/0057775 A1 | 3/2003 | Yamashita et al. | |
| 2003/0160630 A1 | 8/2003 | Earle | |
| 2003/0189465 A1 | 10/2003 | Abadeer et al. | |
| 2003/0231713 A1 | 12/2003 | Masleid et al. | |
| 2004/0041590 A1 * | 3/2004 | Bernstein et al. | 326/95 |
| 2004/0104731 A1 | 6/2004 | Vollertsen | |
| 2004/0119501 A1 | 6/2004 | Sabbavarapu et al. | |
| 2004/0119503 A1 | 6/2004 | Jamshidi et al. | |
| 2004/0124900 A1 | 7/2004 | Brox | |
| 2004/0148111 A1 | 7/2004 | Gauthier et al. | |
| 2004/0257115 A1 | 12/2004 | Bertram et al. | |
| 2005/0184720 A1 | 8/2005 | Bernstein et al. | |
| 2005/0212547 A1 | 9/2005 | Suzuki | |
| 2005/0248368 A1 | 11/2005 | Bertram et al. | |

FOREIGN PATENT DOCUMENTS

| | | |
|---|---|---|
| JP | 03089624 | 4/1991 |
| JP | 04091516 | 3/1992 |

OTHER PUBLICATIONS

Nalamalpu, et al., "Boosters for Driving Long Onchip Interconnects—Design Issues, Interconnect Synthesis, and Comparision With Repeaters", Jan. 2002, IEEE Transactions on Computer-Aided Design of Integrated Circuits and Systems, vol. 21, No. 1, Jan. 2002, pp. 50-62.

Notice of Allowance dated Sep. 6, 2007; U.S. Appl. No. 10/879,645.
Notice of Allowance dated Jul. 23, 2007; U.S. Appl. No. 10/879,645.
Notice of Allowance dated Mar. 15, 2006; U.S. Appl. No. 10/879,645.
Non-Final OA dated Sep. 20, 2005; U.S. Appl. No. 10/879,645.

Taub, et al., Digital Integrated Electronics, 1977, McGraw-Hill, Inc. pp. 98-100.

Ryohei Kaneda, Translation of Japanese Kokai Patent Application No. HEI 3[1991]-89624, publication date: Apr. 15, 1991, pp. 1-6.

Rhyne, "Fundamentals of Digital Systems Design", N.J. 1973, pp. 70-71.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

Chen, G et al., "Dynamic NBTI of p-MOS Transistors and its Impact on MOSFET Scaling" IEEE Electron Device Letters, Dec. 2002, pp. 1-3.

Oner et al., "A compact Monitoring Circuit for Real-Time On-Chip Diagnosis of Hot-Carrier Induced Degradation" Microelectronic test structures. Proceedings, IEEE International Conference in Monterey, Ca. Mar. 17, 1997-Mar. 20, 1997, pp. 72-76.

Peters, Laura. "NBTI: A Growing Threat to Device Reliability," Semiconductor International. Mar. 1, 2004 Http://www.reed-electronics.com/semiconductor/article/CA386329?industryid=3033.

Reddy. V. et al., "Impact of Negative Bias Temperature Instability on Digital Circuit Reliability". 2002 IEE International Reliabilty Physics Symposium Proceedings, Dallas, TX Apr. 7, 2002-Apr. 11, 2002, pp. 248-254.

* cited by examiner

CIRCUIT WITH ENHANCED MODE AND NORMAL MODE

CROSS REFERENCE TO RELATED APPLICATIONS

This patent application is a Continuation of U.S. patent application Ser. No. 11/999,293 by R. Masleid et al., filed on Dec. 4, 2007, entitled "Repeater Circuit With High Performance Repeater Mode and Normal Repeater mode, Wherein High Performance Repeater Mode Has Fast Reset Capability," which is a Continuation of U.S. patent application Ser. No. 10/879,645 by R. Masleid et al., filed on Jun. 28, 2004, entitled "Repeater Circuit With High Performance Repeater Mode and Normal Repeater mode, Wherein High Performance Repeater Mode Has Fast Reset Capability," which is a Continuation-in-Part of U.S. patent application Ser. No. 10/864,271 by R. Masleid et al., filed on Jun. 8, 2004, entitled "Stacked Inverter Delay Chain," and which are assigned to the assignee of the present patent application, and hereby incorporated by reference in their entirety.

This patent application is related to U.S. patent application Ser. No. 10/879,879, filed on Jun. 28, 2004, entitled "Repeater Circuit with High Performance Repeater Mode and Normal Repeater Mode", by R. Masleid et al., assigned to the same assignee of the present patent application, and hereby incorporated by reference in its entirety.

This patent application is related to U.S. patent application Ser. No. 10/879,807 by R. Masleid et al., filed on Jun. 28, 2004, entitled "Circuits and Methods for Detecting and Assisting Wire Transitions," assigned to the assignee of the present patent application, and hereby incorporated by reference in its entirety.

This patent application is related to U.S. patent application Ser. No. 10/879,808 by R. Masleid et al., filed on Jun. 28, 2004, entitled "Repeater Circuit Having Different Operating and Reset Voltage Ranges, and Methods Thereof," assigned to the assignee of the present patent application, and hereby incorporated by reference in its entirety.

BACKGROUND

1. Field

Embodiments generally relates to repeater circuits. More particularly, embodiments relate to the field of repeater circuits with high performance repeater mode and normal repeater mode, wherein high performance repeater mode has fast reset capability.

2. Related Art

In integrated circuit (IC) chip designs, signals (e.g., clock signals, logic signals, power signals, etc.) may propagate along "long" metal wires in comparison to minimum design sizes available in the fabrication process utilized. Propagation delay and distortion are some of the negative effects experienced by the signals propagating along the long metal wires. These negative effects can be minimized by reducing the RC constant of the metal wire. However, in some IC chip designs, the maximum reduction in the RC constant is not sufficient to meet the design specifications. Thus, other techniques are used. One approach involves inserting repeater circuits at periodic intervals along the long metal wires in order to amplify (or remove distortion) the signals as well as to reduce propagation delay (or maintain fast transition times).

SUMMARY

Circuit with enhanced mode and normal mode is provided and described. In one embodiment, switches are set to a first switch position to operate the circuit in the enhanced mode. In another embodiment, switches are set to a second switch position to operate the circuit in the normal mode.

BRIEF DESCRIPTION OF THE DRAWINGS

The accompanying drawings, which are incorporated in and form a part of this specification, illustrate embodiments and, together with the description, serve to explain the principles of the disclosure.

DETAILED DESCRIPTION

Reference will now be made in detail to embodiments, examples of which are illustrated in the accompanying drawings. While the description is made in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding of the embodiments. However, it will be recognized by one of ordinary skill in the art that the embodiments may be practiced without these specific details.

In general, repeater circuits can be classified as a high performance repeater circuit or a normal repeater circuit. Other classifications are possible.

During the layout of an IC chip design, repeater circuits are inserted at periodic intervals along long metal wires in order to amplify (or remove distortion) signals as well as to reduce propagation delay (or maintain fast transition times). Typically, there is a wide selection of repeater circuits within each of the two classifications described above. The selection of a repeater circuit may take into account the advantages and disadvantages of the available repeater circuits, as well as the environment in which the repeater circuit will be inserted.

However, once the IC chip design is fabricated, fabrication process variations can impair the operation of the selected repeater circuits in portions of the IC chip. It is possible that another type of repeater circuit would have operated properly despite the fabrication process variations.

Instead of having to choose between a high performance repeater circuit and a normal repeater circuit, the disclosure provides a repeater circuit that can selectively operate in a high performance repeater mode or in a normal repeater mode. Thus, the operation mode of the repeater circuit can be selected to provide the best performance after the effects of fabrication process variations are known. In an embodiment, the repeater circuit 100 operates in a high performance repeater mode with fast reset capability (as shown in FIG. 1) or in a normal repeater mode (as shown in FIG. 2).

Figure 1:
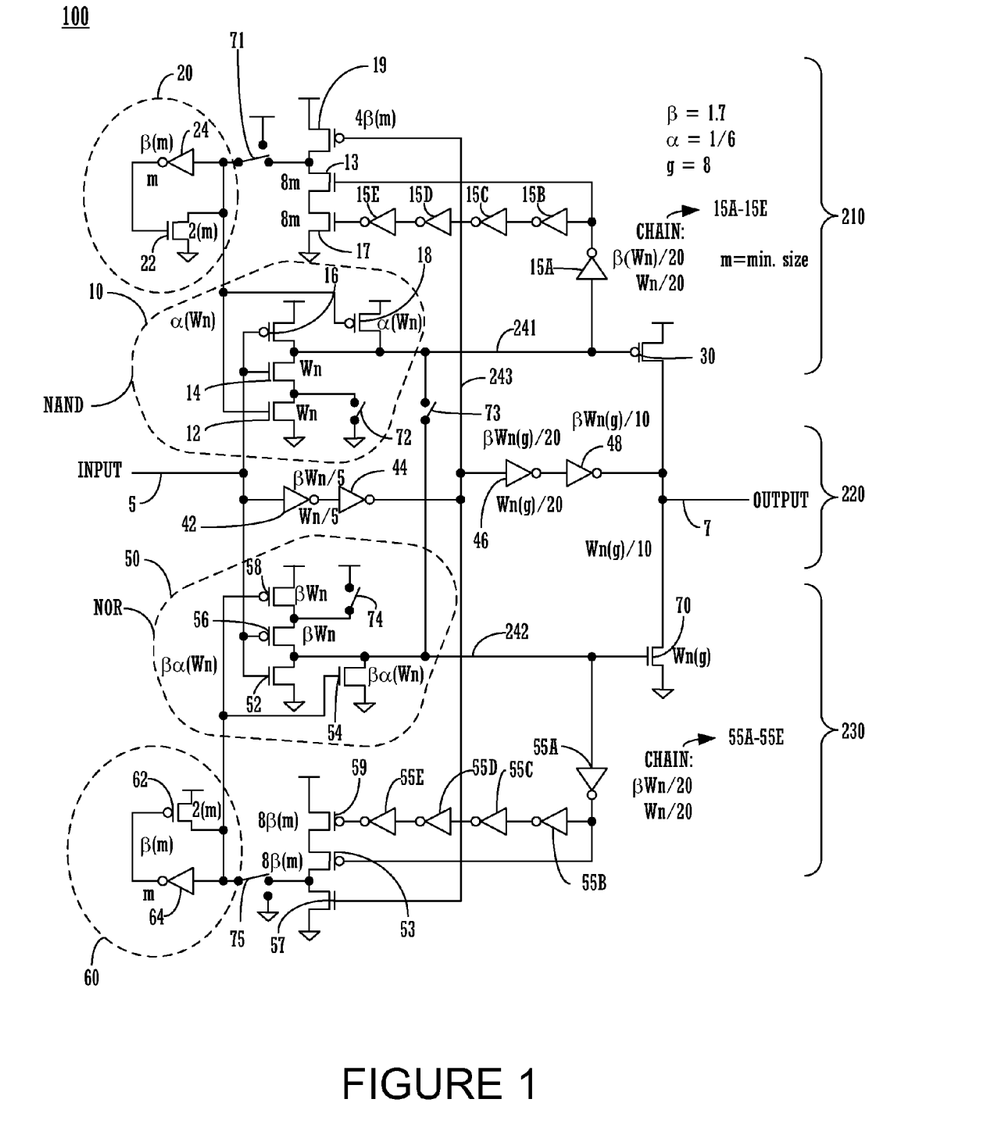
FIG. 1 illustrates a repeater circuit operating in a high performance repeater mode with fast reset capability in accordance with an embodiment, showing switches in a first switch position.
Figure 2:
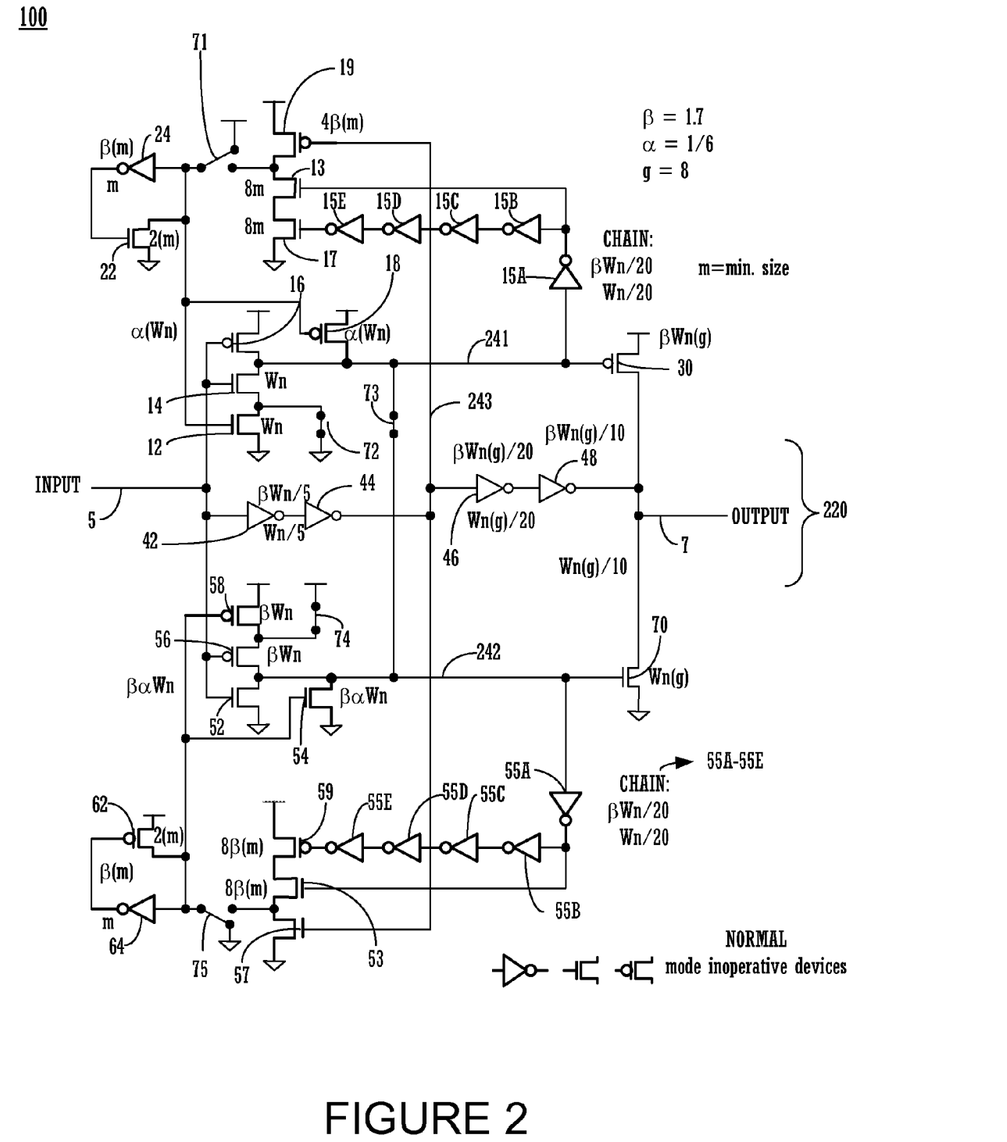
FIG. 2 illustrates a repeater circuit operating in a normal repeater mode in accordance with an embodiment, showing switches in a second switch position.
Figure 3:
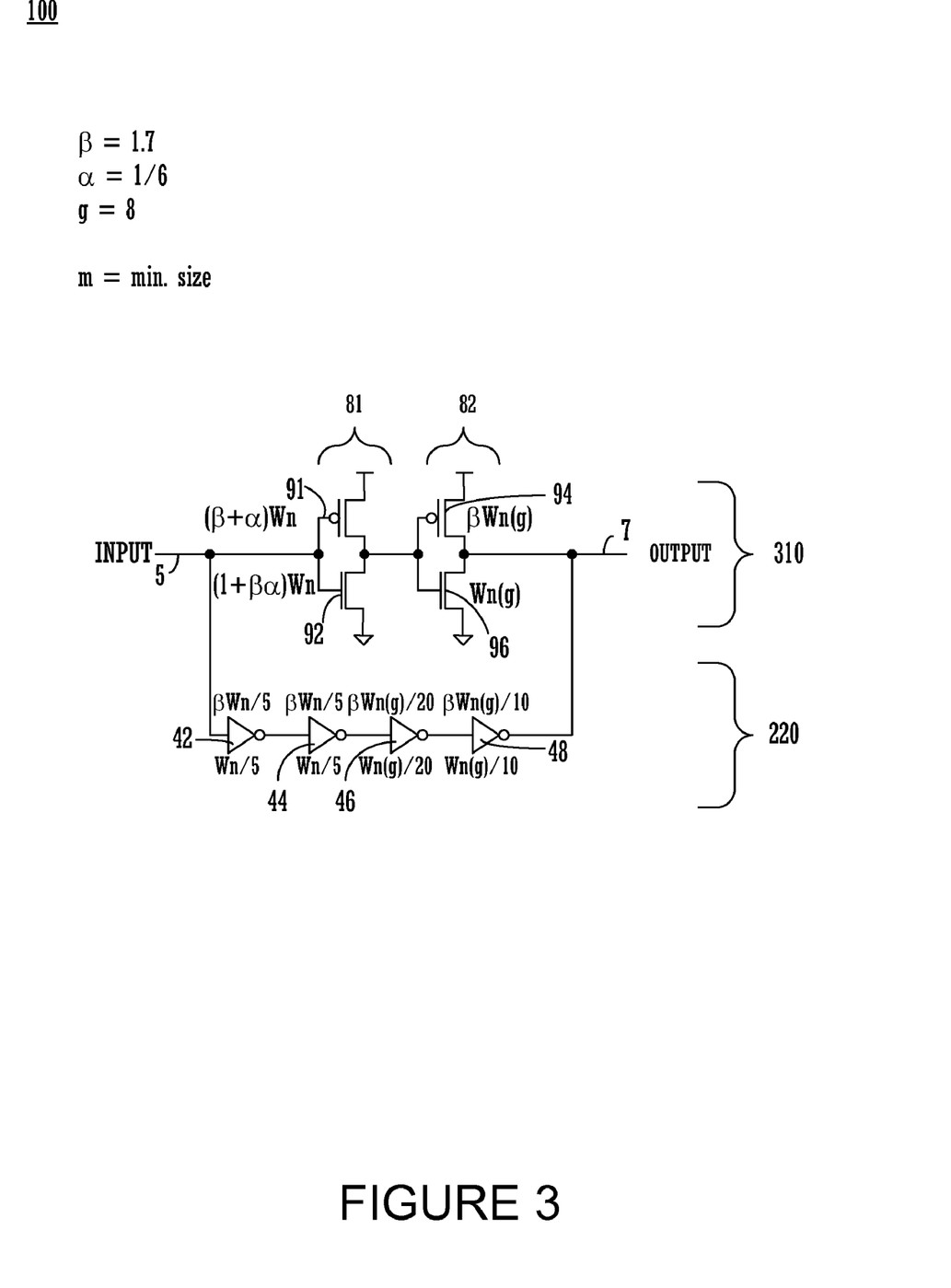
FIG. 3 illustrates the repeater circuit of FIG. 2 with the inoperative components removed in accordance with an embodiment.

FIG. 1 illustrates a repeater circuit 100 operating in a high performance repeater mode with fast reset capability in accordance with an embodiment, showing switches 71-75 in a first switch position. As depicted in FIG. 1, a plurality of switches 71-75 have been inserted at various nodes of the repeater circuit 100. The switches 71-75 can be implemented in any manner (e.g., programmable, static, etc.). When the switches are set at the first switch position illustrated in FIG. 1, the repeater circuit 100 operates in the high performance repeater mode with fast reset capability. However, when the switches are set at the second switch position illustrated in FIG. 2, the repeater circuit 100 operates in the normal repeater mode. The transistor sizes given in FIGS. 1, 2, and 3 are exemplary. Other transistor sizes are possible.

Continuing with FIG. 1, the repeater circuit 100 includes an input node 5, a rising edge drive circuit 210, a keeper circuit 220, a falling edge drive circuit 230, and an output node 7.

The rising edge drive circuit 210 has a NAND gate 10 coupled to the input node 5. The NAND gate 10 includes n-type Metal Oxide Field Effect Transistors (or nFET's) 12 and 14 and p-type Metal Oxide Field Effect Transistors (or pFET's) 16 and 18. Additionally, the output node 241 of the NAND gate 10 is coupled to output drive pFET 30. Moreover, the output node 241 of the NAND gate 10 is coupled to an upper delay circuit having two delay paths. A first delay path includes inverters 15A-15E and nFET 17. A second delay path includes inverter 15A and nFET 13, wherein the delay time of the first delay path is greater than the delay time of the second delay path. A rising edge reset pFET 19 is coupled to the nFET 13. Further, an upper half latch circuit 20 is coupled to nFET 13, rising edge reset pFET 19, and NAND gate 10. The upper half latch circuit 20 has nFET 22 and inverter 24.

The keeper circuit 220 includes inverters 42, 44, 46, and 48 coupled in series between the input node 5 and the output node 7.

Still referring to FIG. 1, the falling edge drive circuit 230 has a NOR gate 50 coupled to the input node 5. The NOR gate 50 includes n-type Metal Oxide Field Effect Transistors (or nFET's) 52 and 54 and p-type Metal Oxide Field Effect Transistors (or pFET's) 56 and 58. Additionally, the output node 242 of the NOR gate 50 is coupled to output drive nFET 70. Moreover, the output node 242 of the NOR gate 50 is coupled to a lower delay circuit having two delay paths. A first delay path includes inverters 55A-55E and pFET 59. A second delay path includes inverter 55A and pFET 53, wherein the delay time of the first delay path is greater than the delay time of the second delay path. A falling edge reset nFET 57 is coupled to the pFET 53. Further, a lower half latch circuit 60 is coupled to pFET 53, falling edge reset nFET 57, and NOR gate 50. The lower half latch circuit 60 has pFET 62 and inverter 64.

Operation of the repeater circuit 100 in response to a falling edge (or transition from logic 1 to logic 0) at the input node 5 is now described. The falling edge at the input node 5 causes the output node 242 of NOR gate 50 to rise, generating the leading edge of a pulse. The rise in output node 242 of NOR gate 50 activates output drive nFET 70, causing output node 7 to fall. Moreover, the falling edge at input node 5 causes the node 243 of the keeper circuit 220 to fall, resetting the rising edge drive circuit 210 by activating the rising edge reset pFET 19.

Moreover, the rise in output node 242 of NOR gate 50 causes the first delay path (inverters 55A-55E) and the second delay path (inverter 55A) to fall, activating pFET 59 and pFET 53 respectively. Activation of both pFETS 59 and 53 initiates latching the lower half latch circuit 60 to logic high (or 1). Thus, the lower half latch circuit 60 causes the output node 242 of NOR gate 50 to fall, generating the trailing edge of the pulse. The fall in output node 242 of NOR gate 50 deactivates output drive nFET 70. The keeper circuit 220 weakly maintains the output node 7 at logic low (or 0), due to the small size of the transistors of the keeper circuit 220.

Additionally, the fall in output node 242 of NOR gate 50 causes the first delay path (inverters 55A-55E) and the second delay path (inverter 55A) to rise. Since the delay time of the second delay path (inverter 55A) is shorter, pFET 53 is deactivated shortly after the trailing edge of the pulse by the inverter 55A. In effect, the longer first delay path (inverters 55A-55E) is bypassed. Further, the rise in the second delay path (inverter 55A) releases the lower half latch circuit 60, terminating the pulse and enabling reset of the falling edge drive circuit 230 during operation of the repeater circuit 100 in response to a rising edge (or transition from logic 0 to logic 1) at the input node 5. Hence, the repeater circuit 100 is immediately ready to respond to the rising edge (or transition from logic 0 to logic 1) at the input node 5. Finally, the first delay path (55A-55E) deactivates the pFET 59.

Operation of the repeater circuit 100 in response to a rising edge (or transition from logic 0 to logic 1) at the input node 5 is now described. The rising edge at the input node 5 causes the output node 241 of NAND gate 10 to fall, generating the leading edge of a pulse. The fall in output node 241 of NAND gate 10 activates output drive pFET 30, causing output node 7 to rise. Moreover, the rising edge at input node 5 causes the node 243 of the keeper circuit 220 to rise, resetting the falling edge drive circuit 230 by activating the falling edge reset nFET 57.

Moreover, the fall in output node 241 of NAND gate 10 causes the first delay path (inverters 15A-15E) and the second delay path (inverter 15A) to rise, activating nFET 17 and nFET 13 respectively. Activation of both nFETS 17 and 13 initiates latching the upper half latch circuit 20 to logic low (or 0). Thus, the upper half latch circuit 20 causes the output node 241 of NAND gate 10 to rise, generating the trailing edge of the pulse. The rise in output node 241 of NAND gate 10 deactivates output drive pFET 30. The keeper circuit 220 weakly maintains the output node 7 at logic high (or 1), due to the small size of the transistors of the keeper circuit 220.

Additionally, the rise in output node 241 of NAND gate 10 causes the first delay path (inverters 15A-15E) and the second delay path (inverter 15A) to fall. Since the delay time of the second delay path (inverter 15A) is shorter, nFET 13 is deactivated shortly after the trailing edge of the pulse by the inverter 15A. In effect, the longer first delay path (inverters 15A-15E) is bypassed. Further, the fall in the second delay path (inverter 15A) releases the upper half latch circuit 20, terminating the pulse and enabling reset of the rising edge drive circuit 210 during operation of the repeater circuit 100 in response to a falling edge (or transition from logic 1 to logic 0) at the input node 5. Hence, the repeater circuit 100 is immediately ready to respond to the falling edge (or transition from logic 1 to logic 0) at the input node 5. Finally, the first delay path (15A-15E) deactivates the nFET 17.

FIG. 2 illustrates a repeater circuit 100 operating in a normal repeater mode in accordance with an embodiment, showing switches 71-75 in a second switch position. As depicted in FIG. 2, when the switches 71-75 are set to the second switch position, the repeater circuit 100 operates in a normal repeater mode.

Referring to FIG. 2, switches 71, 72, and 73 are set to the second switch position, disabling several components of the rising edge drive circuit 210. The inoperative components are shown in a lighter color. In particular, nFET 12, pFET 18, inverters 15A-15E, nFET 17, nFET 13, rising edge reset pFET 19, nFET 22, and inverter 24 are bypassed or disabled.

Similar, switches 73, 74, and 75 are set to the second switch position, disabling several components of the falling edge drive circuit 230. The inoperative components are shown in a lighter color. In particular, nFET 54, pFET 58, inverters 55A-55E, pFET 59, pFET 53, falling edge reset nFET 57, pFET 62, and inverter 64 are bypassed or disabled.

FIG. 3 illustrates the repeater circuit 100 of FIG. 2 with the inoperative components removed in accordance with an embodiment. As shown in FIG. 3, in the normal repeater mode, the repeater circuit 100 of FIG. 2 is converted to a double inverter circuit 310 (having inverters 81 and 82) in parallel with a keeper circuit 220 including inverters 42, 44, 46, and 48. The inverter 81 includes nFET 92 (representing nFETs 52 and 14 of FIG. 2) and pFET 91 (representing pFETs 56 and 16 of FIG. 2). The inverter 82 includes nFET 96 (representing nFET 70 of FIG. 2) and pFET 94 (representing pFET 30 of FIG. 2).

In sum, the switches 71, 72, 73, 74, and 75 provide flexibility in operating the repeater circuit 100 in either the high performance repeater mode with fast reset capability or the normal repeater mode.

The repeater circuit 100 of FIG. 1 configured into the high performance repeater mode with fast reset capability has several advantages over the repeater circuit 100 of FIGS. 2 and 3 configured into the normal repeater mode. First, the high performance repeater mode with fast reset capability configuration reduces propagation delay more than the normal repeater mode configuration. Secondly, the high performance repeater mode with fast reset capability configuration increases the interval length between repeater circuits compared to the normal repeater mode configuration, reducing the number of repeater circuits needed.

Moreover, the fast reset capability enables the repeater circuit 100 (FIG. 1) to (effectively) be immediately available to respond to the opposite edge transition at the input node 5 after the repeater circuit 100 has just completed responding to an edge transition at the input node 5. In particular, release of the half latch circuit (e.g., 20 or 60) by the inverter and transistor (e.g., inverter 15A and nFET 13, or inverter 55A and pFET 53) terminates the pulse generated by either the rising edge drive circuit or falling edge drive circuit respectively, readying the repeater circuit 100 for the opposite edge transition. Thus, the minimum pulse width acceptable at input node 5 can effectively be the pulse width of the pulse generated by either the rising edge drive circuit or falling edge drive circuit. Further, the fast reset capability increases tolerance to glitches at the input node 5.

The normal repeater configuration (FIGS. 2 and 3) provides less performance compared to the high performance repeater mode with fast reset capability configuration. Moreover, the keeper circuit 220 does not significantly affect performance of the double inverter circuit 310, since the transistor sizes of the keeper circuit 220 are relatively small. Moreover, the transistor sizes and transistor ratios of inverters 81 and 82 provide effective performance for normal repeater circuit applications.

Thus, the repeater circuit of this disclosure enables use of a high performance repeater mode with fast reset capability configuration but allows a fall back configuration that is less aggressive (or complicated) for IC chip design consideration. In effect, the normal repeater mode configuration is a "safe" mode while the high performance repeater mode with fast reset capability configuration is an "aggressive" mode.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A circuit comprising:
a keeper circuit;
a first circuit coupled to said keeper circuit;
a second circuit coupled to said keeper circuit; and
a plurality of switches operable in a first position and operable in a second position, wherein said switches if operated in said first position configure said keeper circuit, said first circuit, and said second circuit into an enhanced mode and enable a portion of said first and second circuits, and wherein said switches if operated in said second position configure said keeper circuit, said first circuit, and said second circuit into a normal mode and disable said portion of said first and second circuits.

2. The circuit of claim 1, wherein said first circuit comprises:
a NAND gate including an output;
an output p-type transistor device coupled to said output of said NAND gate;
an upper delay circuit coupled to said output of said NAND gate; and
an upper half latch circuit coupled to said upper delay circuit and said NAND gate.

3. The circuit of claim 1, wherein said second circuit comprises:
a NOR gate including an output;
an output n-type transistor device coupled to said output of said NOR gate;
a lower delay circuit coupled to said output of said NOR gate; and
a lower half latch circuit coupled to said lower delay circuit and said NOR gate.

4. The circuit of claim 1, wherein said switches include a first plurality of switches connected to said first circuit and a second plurality of switches connected to said second circuit, and wherein said keeper circuit comprises:
a first inverter, a second inverter, a third inverter, and a fourth inverter arranged in series.

5. A circuit comprising:
an input node;
a keeper circuit;
a first circuit coupled to said input node and coupled to said keeper circuit;
a second circuit coupled to said input node and coupled to said keeper circuit, wherein a falling edge at said input node resets said first circuit, and wherein a rising edge at said input node resets said second circuit; and
a plurality of switches if operated in a first position configure said keeper circuit, said first circuit, and said second circuit into an enhanced mode, and wherein said switches if operated in a second position configure said keeper circuit, said first circuit, and said second circuit into a normal mode.

6. The circuit of claim 5, wherein said first circuit comprises:
a NAND gate including an output;
an output p-type transistor device coupled to said output of said NAND gate;
an upper delay circuit coupled to said output of said NAND gate; and an upper half latch circuit coupled to said upper delay circuit and said NAND gate.

7. The circuit of claim 6, wherein said upper delay circuit comprises a first long delay circuit and a first short delay circuit.

8. The circuit of claim 5, wherein said second circuit comprises:
- a NOR gate including an output;
- an output n-type transistor device coupled to said output of said NOR gate;
- a lower delay circuit coupled to said output of said NOR gate; and
- a lower half latch circuit coupled to said lower delay circuit and said NOR gate.

9. The circuit of claim 8, wherein said lower delay circuit comprises a second long delay circuit and a second short delay circuit.

10. The circuit of claim 5, wherein said keeper circuit comprises:
- a first inverter, a second inverter, a third inverter, and a fourth inverter arranged in series.

11. A circuit comprising:
- an input node;
- a first circuit coupled to said input node;
- a second circuit coupled to said input node; and
- a plurality of switches operable in a first position and operable in a second position, wherein said switches if operated in said first position enable an enhanced mode and enable a portion of said first and second circuits, wherein said switches if operated in said second position enable a normal mode and disable said portion of said first and second circuits,
- wherein said first and second positions of said switches are independent of a value at said input node.

12. The circuit of claim 11 further comprising:
- a keeper circuit coupled to said first and second circuits, wherein a falling edge at said input node resets said first circuit, and wherein a rising edge at said input node resets said second circuit.

13. The circuit of claim 12, wherein said first circuit comprises:
- a NAND gate including an output;
- an output p-type transistor device coupled to said output of said NAND gate;
- an upper delay circuit coupled to said output of said NAND gate; and
- an upper half latch circuit coupled to said upper delay circuit and said NAND gate.

14. The circuit of claim 13, wherein said upper delay circuit comprises a first long delay circuit and a first short delay circuit.

15. The circuit of claim 14, wherein said first long delay circuit comprises at least one inverter, and wherein said first short delay circuit comprises at least one inverter.

16. The circuit of claim 12, wherein said second circuit comprises:
- a NOR gate including an output;
- an output n-type transistor device coupled to said output of said NOR gate;
- a lower delay circuit coupled to said output of said NOR gate; and
- a lower half latch circuit coupled to said lower delay circuit and said NOR gate.

17. The circuit of claim 16, wherein said lower delay circuit comprises a second long delay circuit and a second short delay circuit.

18. The circuit of claim 17, wherein said second long delay circuit comprises at least one inverter, and wherein said second short delay circuit comprises at least one inverter.

19. The circuit of claim 12, wherein said switches include a first plurality of switches connected to said first circuit and a second plurality of switches connected to said second circuit, and wherein said keeper circuit comprises:
- a first inverter, a second inverter, a third inverter, and a fourth inverter arranged in series.

20. A method comprising:
- configuring a plurality of switches coupled to a driver circuit into a first mode to generate a driver circuit output which includes an enhanced characteristic and to enable a portion of a first circuit and a second circuit of said driver circuit; and
- configuring said plurality of switches coupled to said driver circuit into a second mode to generate said driver circuit output which includes a normal characteristic and to disable said portion of said first circuit and said second circuit of said driver circuit,
- wherein said enhanced and normal characteristics of said driver circuit output are independent of an input signal.

21. The method of claim 20, wherein said switches include a first plurality of switches connected to said first circuit and a second plurality of switches connected to said second circuit, and wherein said driver circuit further comprises:
- a keeper circuit coupled to said first and second circuits.

22. The method of claim 21, wherein said first circuit comprises:
- a NAND gate including an output;
- an output p-type transistor device coupled to said output of said NAND gate;
- an upper delay circuit coupled to said output of said NAND gate; and
- an upper half latch circuit coupled to said upper delay circuit and said NAND gate.

23. The method of claim 21, wherein said second circuit comprises:
- a NOR gate including an output;
- an output n-type transistor device coupled to said output of said NOR gate;
- a lower delay circuit coupled to said output of said NOR gate; and
- a lower half latch circuit coupled to said lower delay circuit and said NOR gate.

24. The method of claim 21, wherein said keeper circuit comprises:
- a first inverter, a second inverter, a third inverter, and a fourth inverter arranged in series.

* * * * *

UNITED STATES PATENT AND TRADEMARK OFFICE
CERTIFICATE OF CORRECTION

| | | |
|---|---|---|
| PATENT NO. | : 8,018,252 B2 | |
| APPLICATION NO. | : 12/546960 | |
| DATED | : September 13, 2011 | |
| INVENTOR(S) | : Masleid et al. | |

It is certified that error appears in the above-identified patent and that said Letters Patent is hereby corrected as shown below:

On the Title Page 2, item (56), under "Other Publications", Line 2, delete "Comparision" and insert -- Comparison --.

On the Title Page 3, item (56), under "Other Publications", Line 2, delete "Reliabilty" and insert -- Reliability --.

Signed and Sealed this
Twenty-eighth Day of February, 2012

David J. Kappos
*Director of the United States Patent and Trademark Office*